United States Patent [19]

Desormiere et al.

[11] 4,092,588
[45] May 30, 1978

[54] METHOD OF MONITORING THE MACHINING BY ION BOMBARDMENT OF A PIEZOELECTRIC WAFER

[75] Inventors: Bernard Desormiere; Marc Berte, both of Paris, France

[73] Assignee: Thomson-CSF, Paris, France

[21] Appl. No.: 773,688

[22] Filed: Mar. 2, 1977

[30] Foreign Application Priority Data

Mar. 5, 1976 France .................. 76 06351

[51] Int. Cl.² .................. C23C 15/00; G01R 29/22
[52] U.S. Cl. .................. 324/56; 156/643; 204/298; 204/192 E; 219/121 EM; 324/57 R; 324/71 E; 324/71 EB
[58] Field of Search ............ 204/192 E, 192 EC, 298; 156/643; 219/121 EM; 324/57 R, 56, 71 E, 71 EB; 73/86

[56] References Cited

U.S. PATENT DOCUMENTS

| | | | |
|---|---|---|---|
| 3,015,950 | 1/1962 | Doctor et al. | 73/86 |
| 3,237,447 | 3/1966 | McKeown | 73/86 |
| 3,253,219 | 5/1966 | Littler | 324/71 |
| 3,664,942 | 5/1972 | Havas et al. | 204/192 E |

OTHER PUBLICATIONS

R. L. Haven, "Deposition Rate Measurement" Western Electric Technical Digest No. 5, Jan. 1967, p. 37.
D. Beecham, "Sputter Machining of Piezoelectric Transducers," J. Appl. Phys., vol. 40, pp. 4357–4361 (1969).
L. Maissel et al, "Handbook of Thin–Film Technology," McGraw–Hill Book Co., N. Y., 1970, pp. 1–97 to 1–120.

*Primary Examiner*—G. L. Kaplan
*Assistant Examiner*—Aaron Weisstuch
*Attorney, Agent, or Firm*—Cushman, Darby & Cushman

[57] ABSTRACT

The present invention relates to the monitoring of the machining of a wafer of piezoelectric material by a beam of charged particles. The monitoring method is performed by measuring and displaying the complex voltage-current relationship produced by the electrical excitation of the wafer using a variable-frequency measuring signal applied to electrodes carried by the wafer.

7 Claims, 2 Drawing Figures

METHOD OF MONITORING THE MACHINING BY ION BOMBARDMENT OF A PIEZOELECTRIC WAFER

The present invention relates to the manufacture of electromechanical resonator devices in which the resonator element or elements is or are formed from a wafer of piezoelectric material locally thinned by an erosion operation down to a given thickness.

The machining of the piezoelectric wafer over a zone of given configuration is performed by bombarding one of its principal faces with an accelerated beam of charged particles. During machining it is advantageous to be able to monitor the reduction in thickness experienced by the wafer at each machined zone, in order to be able to interrupt the action of the beam of incident ions when the desired thickness is reached. Since ion bombardment is carried out in an evacuated enclosure, monitoring of the thickness during machining cannot be done by direct measurement of the thickness of the wafer.

Those skilled in the art will be aware that ion bombardment mechanically excites the wafer and, through the piezoelectric effect, gives rise to a voltage whose frequency spectrum includes a line corresponding to the instantaneous natural resonance frequency. It is well known to pick off this voltage using two electrodes, each of the latter being located upon a respective one of the principal faces of the wafer undergoing machining. By displaying the frequency spectrum of the voltage, it is possible to identify the spectrum line corresponding to the resonance frequency and to follow the progress of this line on the frequency scale until it coincides with the particular desired frequency. This method of monitoring machining is relatively inaccurate since the spectrum line in question has a peak of rounded form which undergoes fluctuations in amplitude and shape.

In order to overcome this drawback, the invention discards the idea of monitoring machining on the basis of the electrical signal produced by ion bombardment. Continuous monitoring of the vibrational properties of the piezoelectric crystal is performed by means of a variable frequency alternating signal which comes from an impedance-measuring device. To this end, the wafer is equipped with measuring electrodes located in proximity of the machining zone. The measuring device makes it possible to display the variation in the impedance or admittance of the system constituted by wafer and electrodes as a function of said variable frequency; the display exhibits an abrupt variation which is correlated to the instantaneous thickness of the wafer at the zone being machined. This display is not subject to any fluctuations in amplitude of the kind referred to earlier.

In accordance with the present invention, there is provided a method of monitoring the progress of the ion machining of a wafer of piezoelectric material designed for the manufacture of an electromechanical resonator device, the machining being performed in an evacuated enclosure and being electrically monitored by an external measuring device, said method comprising the steps of associating with said wafer at least two measuring electrodes, and connecting said electrodes to the measuring terminals of said device; said device measuring the complex relationship linking the current it supplies with the voltage appearing across said measuring terminals (i.e., admittance of impedance); said device including a variable-frequency alternating source and display means, which as a function of said variable frequency, displays said variation of one of the parameters, (e.g., admittance or impedance), which characterizes said complex relationship.

For a better understanding of the present invention, and to show how the same may be carried into effect, reference will be made to the ensuing description and the attached figures among which:

Figure 1:
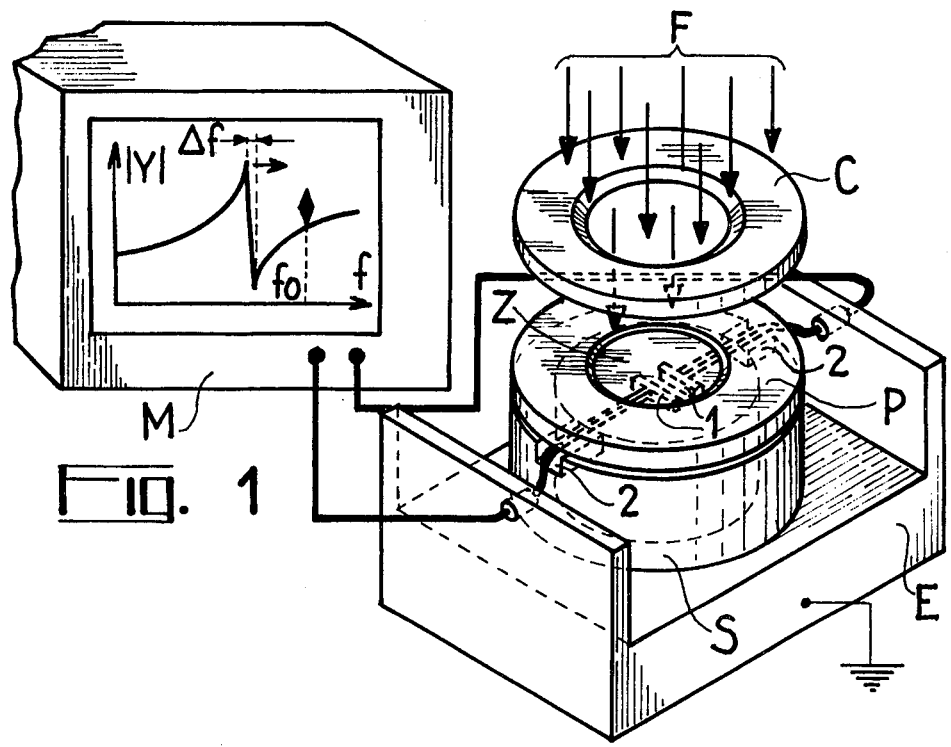
FIG. 1 illustrates an ion machining device equipped with an admittance-measuring device for monitoring the thickness of a piezoelectric wafer.

In FIG. 1, there can be seen an ion machining device which enables accurate monitoring of the machined thickness of a wafer P of piezoelectric material to be effected. The wafer P for machining is arranged in a machining enclosure and equipped with two measuring electrodes 1 which are connected to a variable-frequency admittance-measuring device M. The machining enclosure contains a wafer mount, a source of charged particles projecting an ion beam F towards the mount S, a mask C delimiting the zone Z of the wafer P, which is to be machined, and a heat-dissipation system associated with a base E in heat-transferring contact with the mount S. Appropriate passages 2 are formed in the mount S and make it possible to electrically link the admittance-measuring unit M to the two measuring electrodes 1 located upon that principal face of the wafer P which is opposite to the one at which the machining zone Z is located, at a position opposite said zone. The electrodes 1 can be produced by vapourization under vacuum or by some other deposition technique.

The measuring device M furnishes alternating electrical current of variable frequency $f$ to the wafer P and it is the ratio between the current furnished by the device M and the voltage appearing across its measuring terminals, which is used to monitor the thinning of the machined zone of the wafer. This ratio or its reciprocal (impedance) is displayed as a graph upon the screen of the measuring device M which is a function of the frequency $f$ of the alternating current. Within a frequency range $\Delta f$, this graph exhibits a steeply rising variation which is easy to locate upon the frequency axis $f$. The desired thickness of the wafer underlying the zone Z corresponds to a frequency $f_o$ on the displayed graph. The coincidence between this frequency $f_o$ and a frequency in the range $\Delta f$, determines the point at which machining is to be stopped. This frequency $f_o$ can be located by a predetermined graduation on the frequency axis or by a marker generated by a calibrated frequency generator associated with the measuring device M. The calibrated generator can, if required, consist of an oscillator pilotcontrolled by a reference resonator which, in accordance with a preferred embodiment, may be located in the evacuated enclosure in the immediate neighbourhood of the similar device undergoing machining.

Figure 2:
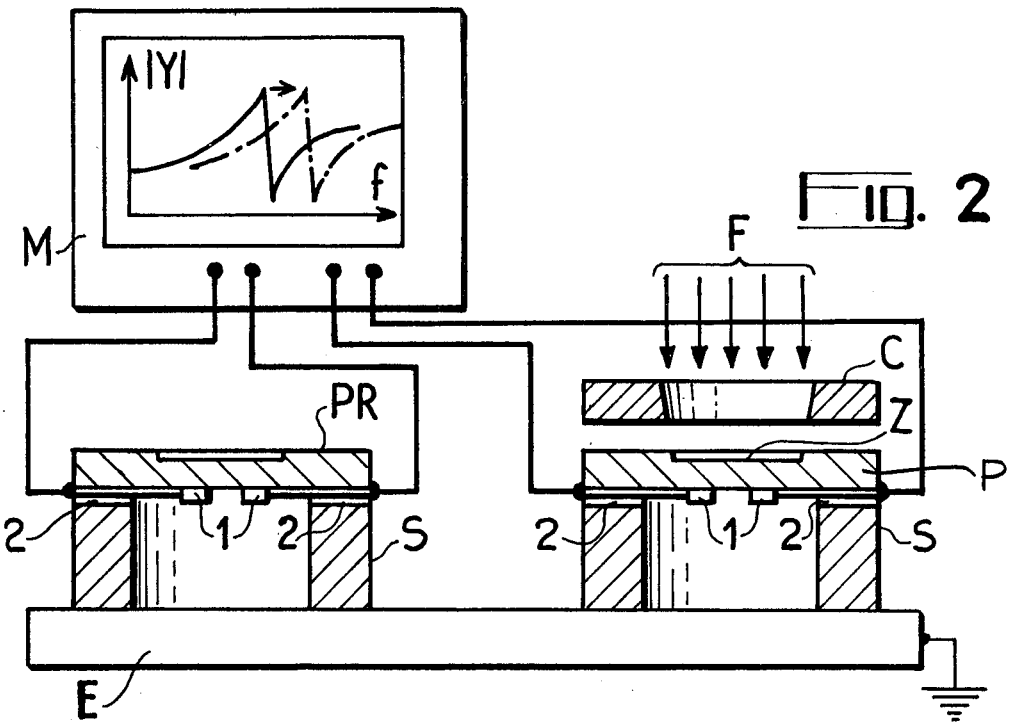
FIG. 2 illustrates a variant embodiment of the device shown in FIG. 1 for monitoring ion machining operations.

The device shown in FIG. 2 requires neither graduation nor marker; it operates in accordance with an alternating display principle.

In the machining enclosure, there are arranged, under conditions which are as near identical as possible, a reference resonator PR and a device P which is undergoing machining. The two devices rest on identical mounts S themselves attached to a common base E. The measuring electrodes Z fitted to each device have the same design; they are connected in two pairs to the measuring terminals of the device M. The two pairs of measuring terminals are alternately switched to the input of the admittance-measuring circuit in order to produce a superimposed display of two admittance-frequency graphs. The full line graph relates to the wafer P being machined and the chain dotted line graph relates to the reference wafer PR. As machining proceeds, the graph relating to the wafer P displaces towards the higher frequencies and when the two graphs coincide this signals the end of machining.

What we claim is:

1. A method of monitoring the progress of the ion machining of a wafer of piezoelectric material used in the manufacture of an electromechanical resonator device, the machining being performed in an evacuated enclosure and being electrically monitored by an external measuring device, said method comprising the steps of associating with said wafer at least two measuring electrodes, connecting said electrodes to the measuring terminals of said device; said device measuring the impedance or admittance value linking the current it supplies with the voltage appearing across said measuring terminals; said device including a variable-frequency alternating source and display means, which as a function of said variable frequency, displays the variation of said impedance or admittance value.

2. A monitoring method as claimed in claim 1, wherein frequency marker means are associated with said display means.

3. A monitoring method as claimed in claim 2, wherein said marker means comprise a marker oscillator whose frequency is controlled by a reference resonator device.

4. A monitoring method as claimed in claim 1, wherein said display means displays said variation of impedance or admittance with frequency and a similar variation obtained by measurements carried out on a reference resonator device comprising a piezoelectric wafer of given thickness.

5. A monitoring method as claimed in claim 4, wherein said reference resonator device is located in the immediate neighbourhood of said wafer being machined in said enclosure.

6. A monitoring method as claimed in claim 1, wherein said measuring electrodes are arranged upon a principal face of said wafer.

7. A monitoring method as claimed in claim 6, wherein the area occupied and delimited by said electrodes is located opposite the zone whose thickness is being monitored, and is smaller than the area of said zone.

* * * * *